United States Patent
Wang et al.

(10) Patent No.: US 8,254,854 B2
(45) Date of Patent: Aug. 28, 2012

(54) PULSED LOAD MODULATION AMPLIFIER AND METHOD

(75) Inventors: Yuanxun Wang, Manhattan Beach, CA (US); Jin-Seong Jeong, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 610 days.

(21) Appl. No.: 12/445,359

(22) PCT Filed: Sep. 27, 2007

(86) PCT No.: PCT/US2007/079746
§ 371 (c)(1),
(2), (4) Date: Apr. 13, 2009

(87) PCT Pub. No.: WO2008/048771
PCT Pub. Date: Apr. 24, 2008

(65) Prior Publication Data
US 2010/0007412 A1    Jan. 14, 2010

Related U.S. Application Data

(60) Provisional application No. 60/852,778, filed on Oct. 18, 2006.

(51) Int. Cl.
*H04B 1/02* (2006.01)
(52) U.S. Cl. .......... 455/108; 455/127.1
(58) Field of Classification Search .......... 455/108, 455/109, 110, 127.1, 127.2; 375/297, 298, 375/268
See application file for complete search history.

(56) References Cited

U.S. PATENT DOCUMENTS

| | | | | |
|---|---|---|---|---|
| 5,420,541 A * | 5/1995 | Upton et al. | | 330/286 |
| 5,751,140 A * | 5/1998 | Canter | | 323/282 |
| 6,026,126 A * | 2/2000 | Gaetano | | 455/127.1 |
| 6,111,531 A * | 8/2000 | Farag | | 341/143 |
| 6,653,896 B2 * | 11/2003 | Sevic et al. | | 330/10 |
| 6,751,265 B1 * | 6/2004 | Schell et al. | | 375/269 |
| 7,042,287 B2 * | 5/2006 | Robinson | | 330/149 |
| 2003/0045252 A1 * | 3/2003 | Nam | | 455/127 |

OTHER PUBLICATIONS

A. Birafane and A. B. Kouki, "On the Linearity and Efficiency of Outphasing Microwave Amplifiers," IEEE Trans. On Microwave Theory & Tech., vol. 52, No. 7, pp. 1702-1708, Jul. 2004.
A. Jayaraman, et al., "Linear High-efficiency Microwave Power Amplifiers Using Bandpass Delta-sigma Modulators," IEEE Microwave Guided Wave Letter, vol. 8, No. 3, pp. 121-123, Mar. 1998.
Jinseong Jeong and Yuanxun Ethan Wang, "Pulsed Load Modulation (PLM) Technique for Efficient Power Amplification," IEEE Transactions on Circuits and Systems II, vol. 55, No. 10, pp. 1011-1015, Oct. 2008.
S. Kim, et al., "Power Efficient RF Pulse Compression through Switched Resonators," 2005 IEEE MTT-S Int. Microwave Symp. Dig., Session WEPG-7, Jun. 2005.
S. Kim and Y. E. Wang, "Theory of Switched RF Resonators," submitted to IEEE Transactions on Circuits and Systems I, Jul. 2005.
F.H. Raab, "Efficiency of Doherty RF Power-amplifier Systems," IEEE Trans. Broadcast, vol. BC-33, No. 3, pp. 77-83, Sep. 1987.

(Continued)

*Primary Examiner* — Lana N Le
(74) *Attorney, Agent, or Firm* — John P. O'Banion

(57) ABSTRACT

Improved power amplifiers and related methods using a pulsed load modulation technique that controls the load modulation characteristics in a digital pulsed fashion.

12 Claims, 4 Drawing Sheets

OTHER PUBLICATIONS

F.H. Raab, "Efficiency of Outphasing RF Power Amplifier Systems," IEEE Transactions on Communications, vol. COM-33, No. 10, pp. 1094-1099, Oct. 1985.

F.H. Raab, et al, "Power Amplifiers and Transmitters for RF and Microwave," IEEE Trans. Microwave Theory & Tech., vol. 50, pp. 814-826, Mar. 2002.

F. H. Raab, et al., "L-Band Transmitter Using Kahn EER Technique," IEEE Trans. on Microwave Theory & Tech., vol. 46, No. 12, pp. 2220-2225, Dec. 1998.

Y. Wang, "A Class-S RF Amplifier Architecture with Envelope Delta-Sigma Modulation," 2002 IEEE Radio and Wireless Conference Digest, pp. 177-179, Sep. 2002.

Y. Wang, "An Improved Kahn Transmitter Architecture Based on Delta-Sigma Modulation," 2003 IEEE MTT-S Int. Microwave Symp. Dig., pp. 1327-1330, Jun. 2003.

* cited by examiner

PULSED LOAD MODULATION AMPLIFIER AND METHOD

CROSS-REFERENCE TO RELATED APPLICATIONS

This application is a 35 U.S.C. §371 national stage entry of, and claims priority to, PCT international application number PCT/US07/79746 filed on Sep. 27, 2007, which in turn claims priority to U.S. patent application Ser. No. 60/852,778 filed on Oct. 18, 2006. Priority is claim to all of the foregoing applications.

TECHNICAL FIELD

This disclosure relates to power amplifiers using pulsed load modulation (PLM).

BACKGROUND

Wireless transmitters often require a variety of waveforms over multiple frequency channels, such as continuous wave, frequency hopping, 16QAM or CDMA etc. The availability of output power, the linearity and bandwidth of the power amplifier and the power efficiency of the transmitter under those various modulation formats are all desired. One well-known problem in maintaining high transmitter efficiency with linear power amplifiers is that the efficiency of conventional microwave power amplifiers is discounted when the output power is backed off because of amplitude fluctuations caused by non-constant envelope modulations. In the past, a number of transmitter efficiency enhancement techniques have been proposed to alleviate this problem [see, e.g., F. H. Raab, P. Asbeck, S. Cripps, P. B. Kennington, Z. B. Popovic, N. Phthercary, J. F. Sevic and N. O. Sokal, "Power Amplifiers and Transmitters for RF and Microwave," IEEE Trans. Microwave Theory & Tech., vol. 50, pp. 814-826, March 2002, and S. C. Cripps, RF Power Amplifiers for Wireless Communications. Norwood, Mass.: Artech House, 1999, both of which are incorporated herein by reference].

Among these techniques, the most promising one is called the load modulation technique. It is based on the simple fact that the power efficiency can be restored when the load impedance is adversely changed according to output power fluctuations. This is to keep the power amplifier devices always operating in close to saturation mode. However, to dynamically adjust the load impedance in RF power amplifiers is not an easy task given the high power conditions and the low loss requirements at the amplifier output. The load modulation itself, if not well controlled, can introduce extra distortions that can affect the linearity. Examples of typical load modulation techniques include the Doherty amplifier [see, e.g., F. H. Raab, "Efficiency of Doherty RF power-amplifier systems," IEEE Trans. Broadcast., vol. BC-33, no. 3, pp. 77-83, September 1987, incorporated herein by reference] and the Chireix's outphasing amplifier [see, e.g., F. H. Raab, "Efficiency of outphasing RF power amplifier systems", IEEE Transactions on Communications, Vol. COM-33, No. 10, pp. 1094-1099, October 1985, and A. Birafane and A. B. Kouki, "On the linearity and efficiency of outphasing microwave amplifiers", IEEE Trans. on Microwave Theory & Tech., Vol. 52, No. 7, pp. 1702-1708, July 2004, both incorporated herein by reference]. Both of these techniques use the load pulling phenomenon that occurs when two transistor outputs are combined to realize load modulations. The load modulations are controlled through different gate biases on the two transistors in the Doherty amplifier and through phase modulations in Chireix's outphasing amplifier.

However, the potential efficiency improvement due to load modulations in either configuration is not optimal when the output power fluctuates over a wide range. In addition, as the load modulations are realized in an analogue fashion, they may incur significant amounts of nonlinear distortions in the amplification process. Pre-distortion techniques are usually required in order to maintain the linearity, which increases the complexity and limits the bandwidth performance of the system. Alternative approaches to load modulation for efficiency enhancement are drain modulation techniques such as Kahn techniques or Envelope Elimination and Restoration (EER) techniques [see, e.g., F. H. Raab, B. E. Sigmon and R. G. Myers, "L-Band transmitter using Kahn EER technique" IEEE Trans. on Microwave Theory & Tech., Vol. 46, No. 12, pp. 2220-2225, December 1998, incorporated herein by reference], which rely on the drain voltage modulation to generate non-constant envelopes at the output and to save DC power consumption. Though the EER technique promises optimal efficiency over any power levels for ideal devices, it requires a linear switching power supply with good efficiency and large output current. Such switching power regulators usually have low switching rates and are not available for broad band modulations.

What is needed is an improved method and apparatus for microwave power amplification that will ideally maintain maximum efficiency over a wide range of power output levels in the microwave spectrum. The embodiments of the present disclosure answer these and other needs.

SUMMARY

In a first embodiment disclosed herein, a method of amplifying an RF signal consisting of a data signal modulated onto a carrier signal comprises separating the RF signal into the carrier signal and the data signal; feeding the carrier signal into a first amplifier; feeding the carrier signal through a first quarter-wave transmission line into a second amplifier; feeding the data signal into a modulator to digitize the data signal; switching the gates of the first and second amplifiers simultaneously in accordance with the digitized data signal; and passing the output of the first amplifier through a second quarter-wave transmission line and combining it with the output of the second amplifier to produce an amplified RF signal.

In another embodiment disclosed herein, an amplifier for amplifying an RF signal consisting of a data signal modulated onto a carrier signal comprises a first amplifier connected to receive the carrier signal; a first quarter-wave transmission line; a second amplifier connected to receive the carrier signal through the first quarter-wave transmission line; a modulator connected to receive the data signal, to digitize the received data signal, and to switch the gates of the first and second amplifiers simultaneously in accordance with the digitized data signal; and a second quarter-wave transmission line connected between the output of the first amplifier and the output of the second amplifier.

These and other features and advantages will become further apparent from the detailed description and accompanying figures that follow. In the figures and description, numerals indicate the various features, like numerals referring to like features throughout both the drawings and the description.

DETAILED DESCRIPTION

Generally speaking, a new concept of designing microwave power amplifiers is introduced in the present disclosure based on a pulsed load modulation (PLM) technique. The disclosed amplifiers and associated methods maintain maximum efficiency over a wide range of power output levels. A novel concept presented herein is to drive a power amplifier with a constant amplitude RF carrier while a pulsed envelope signal is used to turn on and off the power amplifier at the gates. The amplifier may be specially designed with two transistors that are connected with a ¼ transmission line. A high-Q, low-loss filter may be placed at the output to recover the linearity and to generate time-varying equivalent load impedance for the optimal efficiency performance. Ideally, for a pair of identically sized and biased Class B amplifiers, the maximum efficiency of 78.5% should be maintained for up to 6 dB back-off in the output. The present disclosure further presents nonlinear simulations with ideal transistor models of this novel concept.

Figure 1:
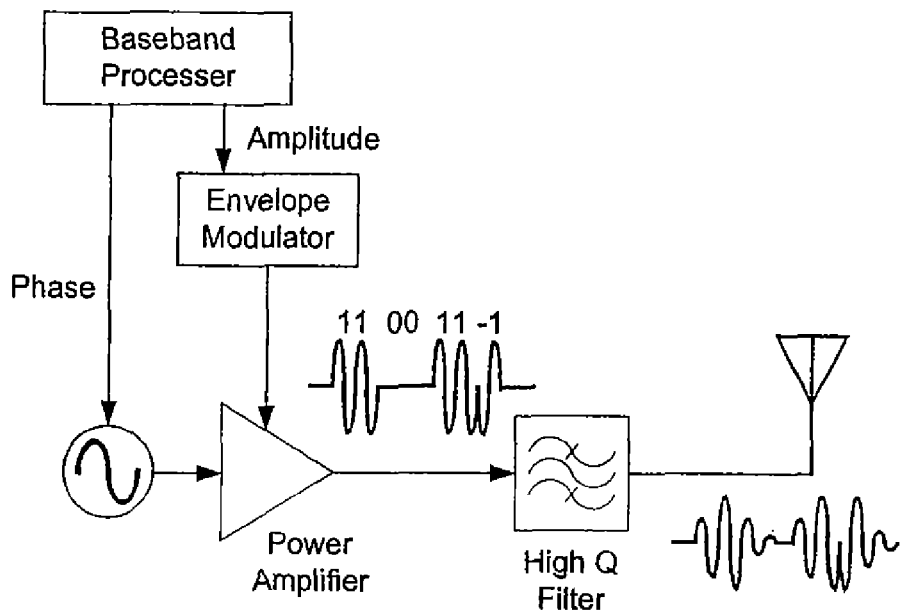
FIG. 1 is a block diagram of the envelope delta-sigma modulation (EDSM) system that may be used in embodiments described in the present disclosure.

To achieve optimal load modulation over both broad ranges of power levels and broadband RF signal amplifications at the same time, the present disclosure introduces a novel pulsed load modulation (PLM) technique that precisely controls the load modulation characteristics in a digital pulsed fashion. In order not to compromise the linearity, the original analog signal to be amplified has to be first discretized into bursts of RF pulses using, e.g., the Envelope Delta-Sigma Modulation technique (EDSM) [see, e.g. Y. Wang, "A Class-S RF Amplifier Architecture with Envelope Delta-Sigma Modulation," 2002 IEEE Radio and Wireless Conference Digest, pp. 177-179, September, 2002, and Y. Wang, "An Improved Kahn Transmitter Architecture Based on Delta-Sigma Modulation," 2003 IEEE MTT-S Int. Microwave Symp. Dig., pp. 1327-1330, June 2003, both incorporated herein by reference]. A block diagram of an EDSM circuit is shown in FIG. 1. As in the EER technique or in other polar amplifier schemes, the signal is separated into a RF carrier path and an envelope path. The envelope is discretized or digitized into rectangular pulses by a low-pass Delta-Sigma modulator. The envelope pulses are modulated back to the carrier signal at the amplifier. This forms bursts of RF voltage pulses at the power amplifier output. The pulses are then filtered by a low-loss bandpass filter to output a continuous current. The original RF signal with the analog envelope is thus restored. Compared to other pulsed amplifier schemes such as Class K amplifiers with bandpass Delta-Sigma modulations [see, e.g. A. Jayaraman, P. F. Chen, G. Hanington, L. Larson, and P. Asbeck, "Linear High-efficiency Microwave Power Amplifiers Using Bandpass Delta-sigma Modulators," IEEE Microwave Guided Wave Letter., vol. 8, no. 3, pp. 121-123, March 1998, incorporated herein by reference], the proposed technique reduces the required bandwidth of the power amplifier and relaxes the switching rate requirement of the Delta-Sigma modulator to below the RF carrier frequency. The pulsed envelope signal can be modulated back to the carrier either through the gate control or switching of the drain supply. The latter approach suffers the same bandwidth problem of EER techniques as it requires a high-speed large current switching power supply. It is much easier if the pulse modulation is realized by simply switching the gate control of the transistors on and off so that none of the power handling capability of the circuitry is compromised. However, the load matching between the PA under switching and the bandpass filter need special consideration and design.

Optimal efficiency performance can be achieved when the load impedance is inversely proportional to the square root of the output power. Such load characteristics can be achieved when the amplifier and the bandpass filter form a switched resonator termination [see, e.g., S. Kim, X. Xu, and Y. E. Wang, "Power Efficient RF Pulse Compression through Switched Resonators", 2005 IEEE MTT-S Int. Microwave Symp. Dig., Session WEPG-7, June, 2005, and S. Kim and Y. E. Wang "Theory of Switched RF Resonators" submitted to IEEE Transactions on Circuits and Systems I, July 2005, both incorporated herein by reference] just like any pulsed RF voltage source connected to a current limiting bandpass filter. It not only provides the filtered signal at the output but also provides the desired load modulation characteristics at the input when the pulse is on. Since a single power transistor does not behave like a voltage source due to its high output impedance when it is turned off through the gate, a combination of two transistor devices with a quarter-wave delay line is used to emulate the output of a voltage source. One provides a constant RF voltage output when the pulse is on and the other provides low output impedance like that of a voltage source through impedance transform when the pulse is off. This absorbs the current flowing out from the filter. It will be shown later that the potential efficiency performance with two identical transistors is optimal for up to 6 dB back off from the peak output power. The range of optimal efficiency can be further extended if an asymmetrical combination of two transistors is used. The linearity performance of the proposed PLM technique is insensitive to the device's non-linearity since the amplification is in pulsed modes and both transistors operate in the voltage saturation most of the time. The pulse rate needed is usually just a few times higher than the amplified signal bandwidth and it can be much smaller than the RF carrier frequency. Thus the technique is feasible for broadband microwave and for millimeter wave applications. On the other hand, a high-Q low-loss microwave filter, such as a cavity filter, must be used at the output in order to avoid power loss. Another challenge of the PLM technique is that the drain-gate breakdown voltage requirement of the transistors is higher than that of ordinary amplifiers because of the rise of the voltages in transient states caused by the switching. This challenge may be addressed by the utilization of wide-band gap devices such as GaN transistors.

Figure 2:
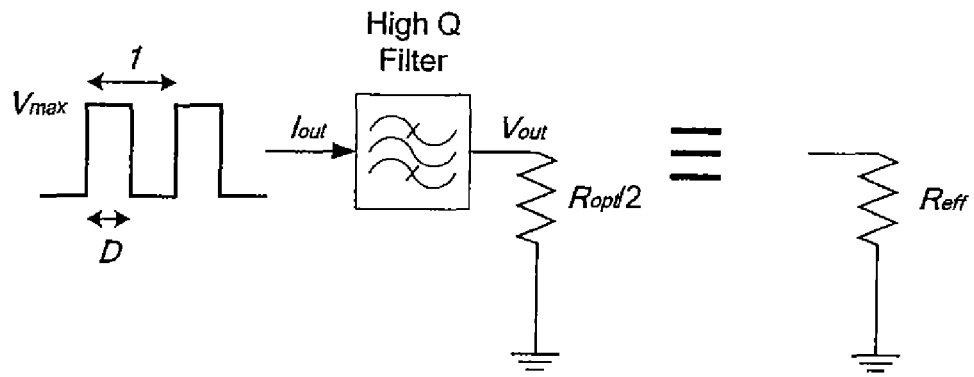
FIG. 2 is a block diagram of a switched resonator consisting of a pulsed voltage source and a high-Q bandpass filter illustrating concepts used in the present disclosure.

The essential concept of the PLM technique is based on the characteristics of the switched resonator termination. As shown in FIG. 2, a high-Q bandpass filter in conjunction with a pulsed voltage source can be used to form a switched resonator [see, e.g., S. Kim, X. Xu, and Y. E. Wang, "Power Efficient RF Pulse Compression through Switched Resonators", 2005 IEEE MTT-S Int. Microwave Symp. Dig., Session WEPG-7, June, 2005, and S. Kim and Y. E. Wang "Theory of Switched RF Resonators" submitted to IEEE Transactions on Circuits and Systems I, July 2005, both incorporated herein by reference]. The voltage source outputs a constant voltage $V_{max}$ when the pulse is on. It forces zero output by short-circuiting to the ground when the pulse is off. The filter is designed in such a way so that its input impedance behavior emulates that of a series LC resonator. This implies an open circuit like out-of-band reflection at the input port of the bandpass filter. The other end of the filter is connected to a constant load resistance given by $R_{opt}/2$. $R_{opt}$ is the optimum matching impedance of the transistor amplifier that will be discussed later. The bandpass filter should prevent any sudden changes to the RF current flowing through it.

Besides converting a pulsed signal to the original analogue signal through filtering, the resonator also exhibits different equivalent impedance values during the energy charging and discharging process before it reaches to the steady state. For example, a barely charged series LC resonator behaves like an open circuit to the RF signal at its resonant frequency. But it changes to a short circuit when the resonator is almost fully charged. By keeping a certain percentage of energy charged in the resonator through the alternations of the charge and discharge process, one can realize any particular equivalence resistance value. During the turning on period, the effective load impedance observed from the input of the filter $R_{eff}$ can be related to the duty cycle of the pulses D. Assuming the switching speed of the envelope modulator is much greater than the bandwidth of the high Q bandpass filter, the output current of PA is then approximately proportional to the duty cycle of envelope modulator D and stays constant during the full cycle. As the input current of a series LC filter equals its output current, the relationship in Eq. (1) should hold.

$$\begin{cases} V_{out} = V_{max}D \\ I_{out} = \dfrac{V_{out}}{R_{opt}/2} \end{cases} \quad (1)$$

The effective load impedance at the "pulse on" state is thus yielded as $$R_{eff} = \frac{V_{max}}{I_{out}} = \frac{1}{D} \cdot R_{opt}/2 \quad (2)$$

The load impedance increases from $R_{opt}/2$ to infinity when the duty cycle drops from 100% to 0. The output power is given by, $$P_{out} = \frac{1}{2} I_{out} V_{out} = 2V_{max}D^2 / R_{opt} \quad (3)$$

Comparing (2) with (3), it is obvious that the optimal load modulation condition required by a power amplifier can be obtained as long as the above assumptions are satisfied.

Figure 3:
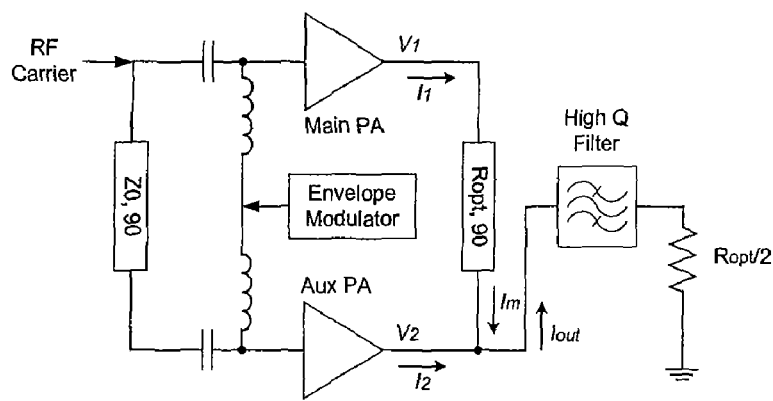
FIG. 3 is a block diagram of an embodiment of a pulsed load modulation amplifier in accordance with the present disclosure.

To take advantage of the switched resonator concept, the RF voltage source can be formed either by combinations of an RF amplifier and a switch, or two RF amplifiers as presented here. This configuration provides better utilization of device power and is thus considered more practical. It consists of a pair of FET devices that are connected through quarter-wave impedance transformers. As shown in FIG. 3, this is similar to how a Doherty amplifier is connected. The switched envelope pulses are generated by the envelope modulator. It controls the gates of both devices by turning them on and off simultaneously. A high-Q current filter is placed at the output to prevent sharp changes to the current and to restore the original analog envelope. Combining two amplifiers is to form a voltage source at the input of the filter for both linearity and efficiency purposes. It requires the PA to provide a low voltage level with the maximum current absorption, e.g., RF short at the input of the filter when the envelope modulator output is "0" and a stable RF voltage with the maximum current output capability when the output is "1." This is to preserve the linearity of the filtering process required by the assumption of Delta-Sigma modulations. As the output current is simply a filtered version of the pulsed voltage input, it is not subject to the impact of impedance variations due to switching. Another attribute that necessitates the pulsed voltage source equivalence is that the optimal load modulation characteristics can be maintained for different power levels from the previous switched resonator analysis.

The operating principle of the PLM technique using two identical transistors is explained in detail as follows: assuming both devices work in Class B and the maximum drain voltages and current are $V_{max}$ and $I_{max}$. For Class B, $V_{max}=2V_{dc}$ where $V_{dc}$ is the drain supply voltage. $I_{max}$ is chosen to be slightly under the maximum current rating of the device. The optimum impedance $R_{opt}$ is defined by $V_{max}/I_{max}$. The definition of the main PA and the auxiliary PA is shown in FIG. 3. To form a "pulse off" state, both devices are turned off and both PAs are open circuits looking from the load. However, at the combined output, the high output impedance of the main PA is transformed into a short circuit. Thus the amplifier pair forces zero voltage at the combined output by absorbing the current from the filter into this short-circuit. At the "pulse on" state, both devices are turned on and driven into voltage saturation. The maximum output current is $2I_{max}$ because the load impedance is set to $R_{opt}/2$. When the transistors are switched off and on, the filter limits the output current to a value between zero and $2I_{max}$, the effective load impedance looking into the filter is higher than $R_{opt}/2$. As the auxiliary PA sees an effective load impedance value higher than $R_{opt}$, it is driven into deeper voltage saturation, which forces the voltage at the combiner output $V_2$ to be $V_{max}$. Therefore, at the combined output the PA works like a RF voltage source with pulsed amplitudes between $V_{max}$ and 0. In the "pulse on" state, the maximum output voltage at the combiner in turn forces the current output of the main PA to reach the maximum because of the current and voltage transfer relations of the quarter-wave impedance transformer given in (4).

$$V_1 = jR_{opt}I_m, \quad V_2 = jR_{opt}I_1 \quad (4)$$

The auxiliary PA can be thus modeled as a voltage source ($V_{max}$) and from (4) the main PA can be modeled as a current source ($jI_{max}$) and they are given by $$V_2 = V_{max}, \quad I_1 = jI_{max} \quad (5)$$

Figure 4:
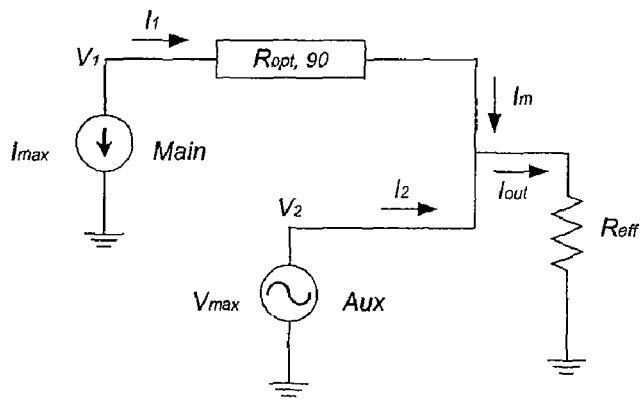
FIG. 4 is an equivalent circuit of the pulsed load modulation amplifier embodiment of FIG. 3.

Thus the connection of two transistors with a quarter-wave transformer behaves like a combination of a current source and a voltage source in equal phase and equal potential depicted in FIG. 4. Strictly speaking, the current dividing ratio between the two branches of equal potential can be arbitrary. However, one can always drive the main PA slightly harder so that the main branch has slightly higher potential at the combiner output. Thus the main branch should provide a portion of the total output current to the maximum degree possible. The auxiliary PA should then provide the rest of the current. It is clear that the auxiliary PA always operates in voltage saturation mode and exhibits the highest possible power efficiency. However, the overall power efficiency including the main PA has to be discussed separately in two situations at different levels of power back off.

When the power back off level is less than 6 dB, this corresponds to a duty cycle of $0.5 \leq D < 1$. As $I_{out}$ is greater than $I_{max}$, the main PA branch should provide the maximum possible current of $I_{max}$ and the auxiliary PA should provide the remaining current as follows $$I_m = I_{max}$$

$$I_2 = I_{out} - I_m = I_{max}(2D-1) \quad (6)$$

The main PA output voltage should also reach its maximum because of the impedance transformer, $$V_1 = jR_{opt}I_m = jV_{max} \quad (7)$$

The output current is given by $I_1 = jI_{max}$ according to (5). Therefore, the main PA operates under the optimum match condition with the best efficiency regardless of power back off. The DC power consumption can be calculated using $\gamma$, the ratio between the DC current and the RF current ($\gamma = \pi/2$ for Class B).

$$P_{DC} = (I_{DC1} + I_{DC2})V_{DC} = (\gamma DI_1 + \gamma DI_2)$$
$$V_{DC} = 2\gamma I_{max} V_{max} D^2 \quad (8)$$

In conjunction with (3), the drain efficiency is calculated to be optimal over this range, $$\eta = \frac{P_{out}}{P_{DC}} = \frac{1}{2\gamma} = \frac{\pi}{4} = 78.5\% \quad (9)$$

When the power back off level is more than 6 dB, e.g. $0 < D < 0.5$, the total current $I_{out}$ is less than $I_{max}$. Thus all the current is provided by the main PA, as $$I_m = 2I_{max}D$$

$$I_2 = 0 \quad (10)$$

The output voltage of the main PA is thus given by $$V_1 = jR_{opt}I_m = j2V_{max}D \quad (11)$$

The output current still satisfies $I_1 = jI_{max}$. The effective load impedance of the main PA becomes $2DR_{opt}$ which is less than the optimum impedance. Efficiency drop is thus expected. The DC power consumption is given as $$P_{DC} = (I_{DC1} + I_{DC2})V_{DC} = (\gamma DI_1 + \gamma DI_2)V_{DC} = \gamma I_{max}V_{max}D \quad (12)$$

Since $P_{out}$ is proportional to $D^2$, the drain efficiency in this range of duty cycles is twice that of the Class B amplifier efficiency with the same amount of power back off, as indicated in Eq. 12.

$$\eta = \frac{P_{out}}{P_{DC}} = \frac{1}{\gamma}D = \frac{\pi}{2}D \propto \sqrt{P_{out}} \quad (13)$$

Figure 5:
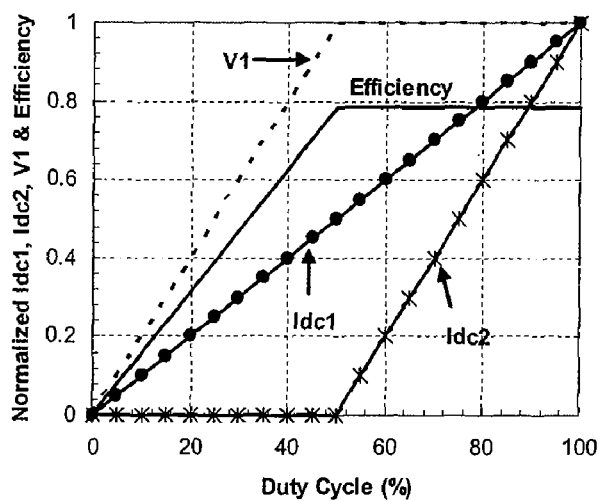
FIG. 5 is a graph depicting normalized DC current, drain voltage and efficiency performance of an ideal pulsed load modulation amplifier according to the present disclosure.

FIG. 5 summarizes the above equations with the plots of main PA output voltage, DC currents for both transistors, and the efficiency curve versus different duty cycles of pulses. The maximum drain efficiency is maintained for up to 6 dB back off from the peak output power. It is also clearly seen that the efficiency enhancement results from the faster DC current drop rate in the auxiliary PA versus the decrease of the output power level. In fact, the DC current behavior can be very helpful in identifying whether the pulsed load modulation technique operates properly in tests and measurements.

Figure 6:
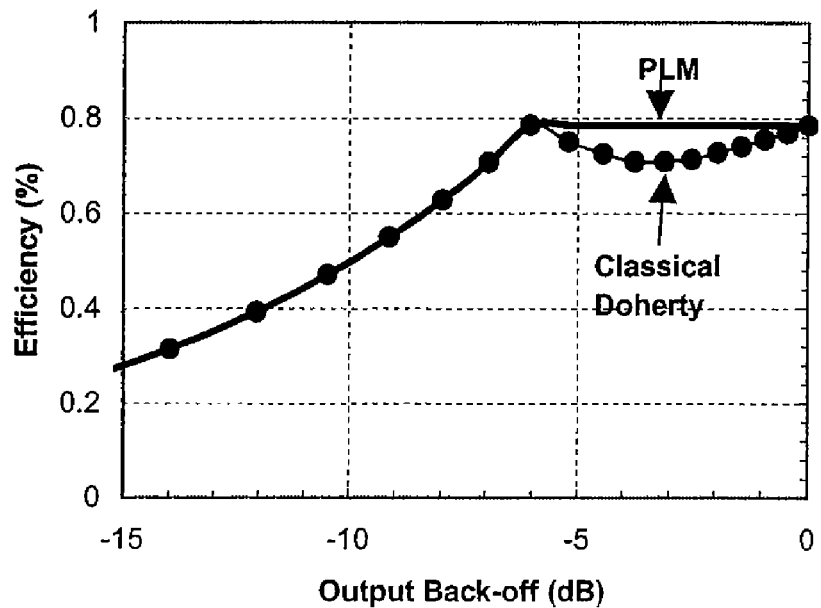
FIG. 6 is a graph depicting the efficiency curve of a pulsed load modulation amplifier according to the present disclosure versus a typical Doherty Amplifier.

Despite the similarity in the way the transistors are combined, the operating principle of the PLM amplifier is fundamentally different from that of traditional Doherty amplifiers in the following two aspects. First, in Doherty amplifiers, the main amplifier remains at saturation at a certain range of output power, but the auxiliary amplifier operates at saturation only for two discrete levels of output power, which results in an efficiency drop in the middle range. In the proposed PLM scheme, this problem no longer exists as both amplifiers work in saturation mode for up to 6 dB output back off level in the case where identical amplifier devices are used. In FIG. 6, the theoretical efficiency performance of the PLM technique is compared to that of the classical Doherty amplifier. A flat efficiency curve until 6 dB back off should be maintained for the PLM amplifier while the Doherty amplifier has an efficiency dip of about 90% of the optimal value. Though the efficiency difference between these two techniques seems to be minor, the PLM technique allows for further extension of the optimal efficiency range if asymmetrical pairs of devices are used, without incurring a deeper efficiency drop like in the extended Doherty amplifier [13]. In terms of the linearity, Doherty amplifiers intrinsically work in a linear mode, which requires a more accurate control of the bias conditions, the gain characteristics and even the peripheral sizes of the devices in order to achieve linear amplification. These requirements are no longer necessary in the proposed PLM scheme as both transistors are overdriven to the saturation mode and the linearity is controlled by the duty cycle of the pulse modulations.

Figure 7:
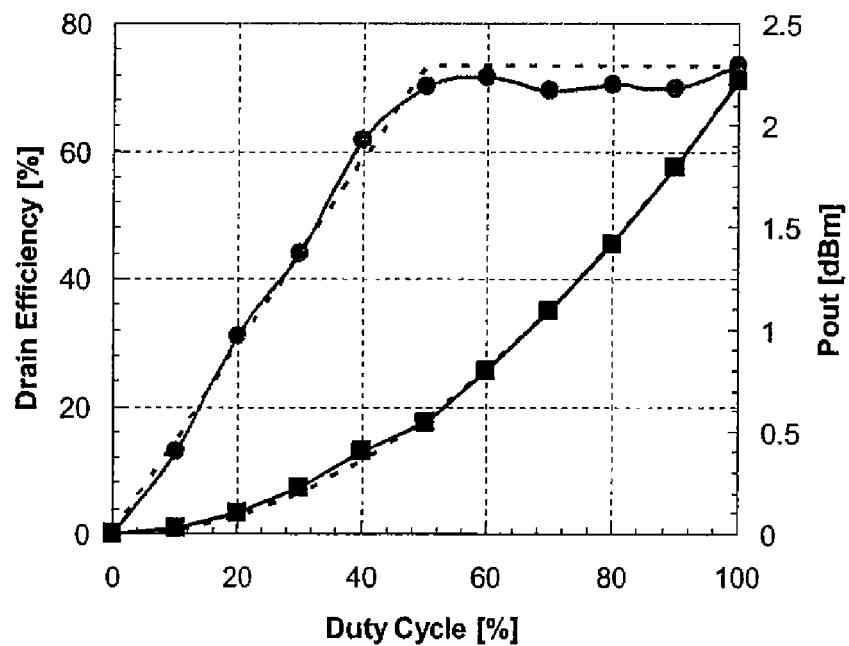
FIG. 7 is a graph depicting the simulated drain efficiency and power curves versus duty cycle for a pulsed load modulation amplifier according to the present disclosure.

To validate the PLM theory, simulations are performed using an equation-based nonlinear transistor model. The equation is given by $$I_{DS} = \frac{V_{GS} + |V_{GS}|}{2} \cdot g_m \cdot \tanh(10 \cdot V_{DS}) \quad (14)$$

Where $I_{ds}$ is the drain-source current, $V_{gs}$ is the gate-source voltage, $V_{ds}$ is drain-source voltage and $g_m$ is the transconductance of the transistor. The hyperbolic tangent function approximates the knee effect of the transistor and no breakdown effect was assumed. The drain capacitance is assumed to be 10 pF and is tuned out with a biasing inductor at the fundamental frequency. For both amplifiers, the drain bias, $V_{dd}$, is set to 5V and $I_{max}$ is 1 A. Therefore, the optimum load is 10 ohm and the maximum power is 1.25 W for each amplifier. The RF frequency is 1.87 GHz and the gate switching rate is 25 MHz. The output filter is a high Q series LC resonator and its bandwidth is chosen to be 5 MHz. After performing harmonic balance simulations, FIG. 7 shows the drain efficiency as well as the output power versus different duty cycles. Dashed lines represent ideal characteristics of the PLM technique from the theory. The maximum efficiency simulated is about 74%. The simulation results agree with the theory very well in general, except for a small drop of 3% or 4% in efficiency while the amplifier starts to operate in the pulsed mode. This may be due to power loss during the transient switching process.

To further validate the theory and examine the feasibility, an amplifier was built with a pair of FLL351 GaAs FETs from Fujitsu. The amplifier operates at 1.87 GHz and it is biased in Class B. RT/duroid was used as the substrate and the amplifiers, microstrip splitter/combiner and the cavity filter were connected with SMA connectors with the insertion loss calibrated. A base station duplexer for PCS band was used as the output filter and had about a 30 MHz bandwidth at the center frequency of 1.87 GHz. The average passband insertion loss was 0.7 dB. As aforementioned, the stopband performance of the filter is also important besides the passband insertion loss. The stopband return should be almost completely reflective with relatively flat phase response over a certain bandwidth depending on the switching frequency. A 25 W T-line was added in front of the filter to adjust the phase of S11 to approximately zero degree, to emulate an open circuit reflection. The amplifier operated under a 5V drain supply voltage and output a maximum output power of 2 Watts. A duty cycle test was performed to validate the efficiency performance at different power back off levels. The switching speed was 25 MHz with a duty cycle from 10% to 100% and the rising and falling time was 1 ns.

Figure 8:
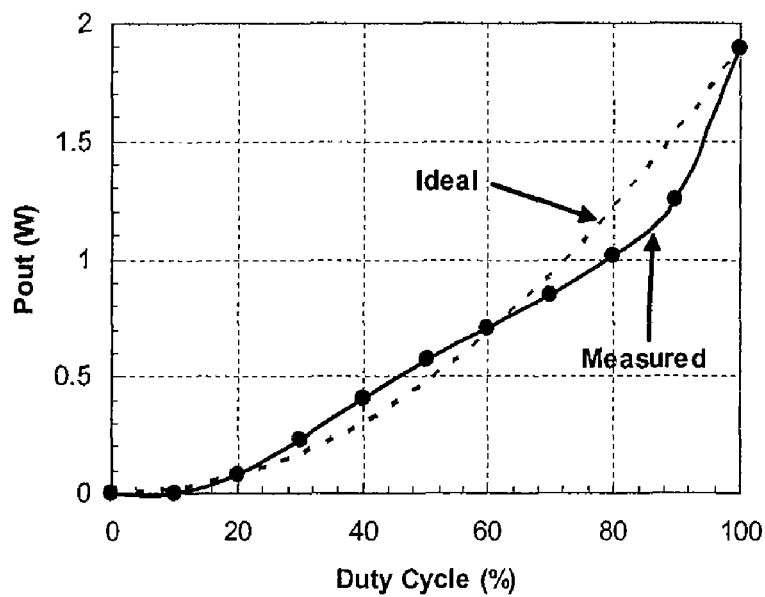
FIG. 8 is a graph depicting a measured drain efficiency curve versus duty cycle for a pulsed load modulation amplifier according to the present disclosure.
Figure 9:
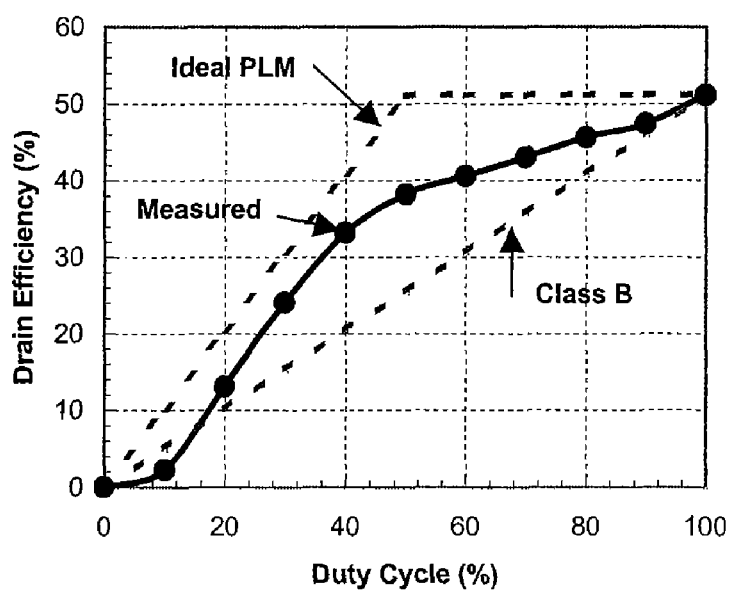
FIG. 9 is a graph depicting a measured output power curve versus duty cycle for a pulsed load modulation amplifier according to the present disclosure.

Measurement results in FIG. 8 show similar efficiency behavior as predicted. The drain efficiency is about 50% at full power and 38% at 6 dB back off including the cavity filter insertion loss. This is compared to 25% at 6 dB back off for the Class B case. Measured output power versus duty cycle is depicted in FIG. 9. Output power should be proportional to the square of the duty cycle to assure linearity. Deviation in the linearity curve is believed to be mainly related to the "soft breakdown" phenomenon of the FET device, as similar behavior has been observed in simulations with non-linear transistor models including the breakdown effect. This may necessitate a high break down design in the power amplifier.

In accordance with the foregoing disclosure, by turning the power transistors on and off at the gates with digital pulses, an RF signal can be modulated and amplified at the same time. A high-Q bandpass filter, in conjunction with the transistor device, can be used to form a switched resonator that exhibits a controllable equivalent input impedance. It is expected that the methods disclosed herein can provide dynamic load matching to power amplifiers with a wide range of output power levels for optimal efficiency. Amplifiers according to the present disclosure may be implemented with commercially available packaged GaAs FETs.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A method of amplifying an RF signal consisting of a data signal modulated onto a carrier signal, comprising:
    separating an RF signal into a carrier signal and a data signal;
    feeding the carrier signal into a first amplifier having a gate and an output;
    feeding the carrier signal through a first quarter-wave transmission line into a second amplifier having a gate and an output;
    feeding the data signal into a modulator to digitize the data signal into a digitized data signal having rectangular pulses with duty cycles proportional to output current;
    switching the gates of said first and second amplifiers simultaneously in accordance with said digitized data signal;
    passing the output of said first amplifier through a second quarter-wave transmission line and combining it with the output of said second amplifier to produce an amplified RF signal; and
    passing said amplified RF signal through a high-Q bandpass filter having high-impedance in its stop-band to reject quantization noises of said digitized data signal and form a dynamically varying impedance inversely proportional to the duty cycles of said rectangular pulses from said modulator when driven by said first and second amplifiers which are pulse switched.

2. The method of claim 1, wherein the modulator is a lowpass Delta-Sigma modulator.

3. The method of claim 1, wherein the amplifiers are FET devices.

4. The method of claim 1, wherein the first and second amplifiers are identical class B devices.

5. The method of claim 4, further comprising:
    feeding the amplified RF signal to a load having an impedance approximately equal to half the ratio of the maximum drain voltage to the maximum drain current of the amplifiers.

6. An amplifier for amplifying an RF signal consisting of a data signal modulated onto a carrier signal, comprising:
    a first amplifier connected to receive the carrier signal;
    a first quarter-wave transmission line;
    a second amplifier connected to receive the carrier signal through said first quarter-wave transmission line;
    wherein said first and second amplifiers each have a gate and an output;
    a modulator connected to receive the data signal as a received data signal, and to digitize the received data signal into a digitized data signal having rectangular pulses with duty cycles proportional to output current, and to switch the gates of said first and second amplifiers simultaneously in accordance with said digitized data signal;
    a second quarter-wave transmission line connected between the output of said first amplifier and the output of said second amplifier; and
    a high-Q bandpass filter connected at a junction of said second quarter-wave transmission line and the output of said second amplifier, with high-impedance in its stopband to reject quantization noises of the data digitized signal and to form a dynamically varying impedance inversely proportional to the duty cycles of said rectangular pulses from said modulator when driven by said first and second amplifiers which are pulse switched.

7. The amplifier of claim 6, wherein the modulator is a low-pass Delta-Sigma modulator.

8. The amplifier of claim 6, wherein the amplifiers are FET devices.

9. The amplifier of claim 6, wherein the first and second amplifiers are identical class B devices.

10. The amplifier of claim 9, further comprising:
a load connected to receive the amplified RF signal and having an impedance approximately equal to half the ratio of the maximum drain voltage to the maximum drain current of the amplifiers.

11. A method of amplifying an RF signal consisting of a data signal modulated onto a carrier signal, comprising:
separating the RF signal into the carrier signal and the data signal;
feeding the carrier signal into a first amplifier;
feeding the carrier signal through a first quarter-wave transmission line into a second amplifier;
feeding the data signal into a modulator to digitize the data signal;
switching the gates of the first and second amplifiers simultaneously in accordance with the digitized data signal;
passing the output of the first amplifier through a second quarter-wave transmission line and combining it with the output of the second amplifier to produce an amplified RF signal;
wherein the first and second amplifiers are identical class B devices; and
feeding the amplified RF signal to a load having an impedance approximately equal to half the ratio of the maximum drain voltage to the maximum drain current of the amplifiers.

12. An amplifier for amplifying an RF signal consisting of a data signal modulated onto a carrier signal, comprising:
a first amplifier connected to receive the carrier signal;
a first quarter-wave transmission line;
a second amplifier connected to receive the carrier signal through the first quarter-wave transmission line;
a modulator connected to receive the data signal, to digitize the received data signal, and to switch the gates of the first and second amplifiers simultaneously in accordance with the digitized data signal;
a second quarter-wave transmission line connected between the output of the first amplifier and the output of the second amplifier;
wherein the first and second amplifiers are identical class B devices; and
a load connected to receive the amplified RF signal and having an impedance approximately equal to half the ratio of the maximum drain voltage to the maximum drain current of the amplifiers.

* * * * *